(12) United States Patent
Sun

(10) Patent No.: US 6,970,121 B1
(45) Date of Patent: Nov. 29, 2005

(54) DIGITAL TO ANALOG CONVERTER, LIQUID CRYSTAL DISPLAY DRIVING CIRCUIT, METHOD FOR DIGITAL TO ANALOG CONVERSION, AND LCD USING THE DIGITAL TO ANALOG CONVERTER

(75) Inventor: Wein-Town Sun, Kaohsiung (TW)

(73) Assignee: AU Optronics Corp., Hsinchu (TW)

(*) Notice: Subject to any disclaimer, the term of this patent is extended or adjusted under 35 U.S.C. 154(b) by 0 days.

(21) Appl. No.: 11/085,747

(22) Filed: Mar. 21, 2005

(30) Foreign Application Priority Data

Aug. 30, 2004 (TW) ............................ 93126046 A

(51) Int. Cl.[7] .............................................. H03M 1/66
(52) U.S. Cl. ..................... 341/144; 341/145; 345/87; 345/98; 345/204
(58) Field of Search .................. 341/144, 145, 341/141, 159; 345/87, 89, 99, 204, 98, 95, 345/90, 205, 92

(56) References Cited

U.S. PATENT DOCUMENTS

| | | | |
|---|---|---|---|
| 6,154,121 A * | 11/2000 | Cairns et al. ............... 341/138 |
| 6,256,024 B1 | 7/2001 | Maekawa ................... 345/205 |
| 6,556,162 B2 | 4/2003 | Brownlow et al. ......... 341/145 |
| 6,750,835 B2 * | 6/2004 | Azami .......................... 345/89 |
| 6,756,959 B2 * | 6/2004 | Fujino .......................... 345/95 |

* cited by examiner

Primary Examiner—John B Nguyen
(74) Attorney, Agent, or Firm—Thomas, Kayden, Horstemeyer & Risley

(57) ABSTRACT

Digital to analog converters (DAC). A first MSB DAC receives MSB data of a first digital video signal in a first clock period, and outputs a first voltage range signal. A second MSB DAC receives MSB data of a second digital video signal in a second clock period, and outputs a second voltage range signal. A delay circuit receives LSB data of the first digital video signal in the first clock period, and outputs the signal in the second clock period. A LSB DAC outputs first image data according to the first voltage range signal and the LSB data of the first digital video signal in the second clock period. A first switch is connected between the first MSB DAC and the LSB DAC, and is turned on to provide the first voltage range signal to the LSB DAC in the second clock period.

21 Claims, 6 Drawing Sheets

DIGITAL TO ANALOG CONVERTER, LIQUID CRYSTAL DISPLAY DRIVING CIRCUIT, METHOD FOR DIGITAL TO ANALOG CONVERSION, AND LCD USING THE DIGITAL TO ANALOG CONVERTER

BACKGROUND

The disclosure relates in general to a digital to analog converter. In particular, the disclosure relates to a digital to analog converter for liquid crystal displays (LCD).

To meet the requirements of low power consumption, system integration and size reduction, low-temperature polysilicon LCDs receive digital data and convert it to analog data via a driver.

FIG. 1 is a block diagram showing a conventional LTPS TFT-LCD. As shown in FIG. 1, the LTPS TFT-LCD disclosed in U.S. Pat. No. 6,256,024 has a structure in which a pixel and a driving circuit for receiving a digital signal having a signal level less than that of a power source voltage (Vdd) of the horizontal driving circuit system are formed in combination on a glass substrate. The LTPS TFT-LCD comprises a horizontal shift register 122, a set of sampling switches 102-1 to 102-n, a set of level shifters 104-1 to 104-n, a set of latches 106-1 to 106-n, a set of digital-to-analog converters (DACs) 108-1 to 108-n, a set of buffers 110-1 to 110-n, a pixel 116, data lines 114-1 to 114-n, scan lines 112-1 to 112-n and a vertical shift register 120.

The scan lines 112-1 to 112-n are vertically scanned in succession by the vertical shift register 120 which functions as a vertical scanning circuit and driver. The horizontal shift register 122, which functions as a horizontal scanning circuit, generates a sampling pulse for sampling an input digital data in time series corresponding to a pixel based on a horizontal start pulse Hst and horizontal clock pulse Hck, and generates a level shift pulse as described hereinafter. The sampling switches 102-1 to 102-n are provided corresponding to n column lines 114-1 to 114-n, and sample digital data on a data bus line in response to the sampling pulse supplied successively from the horizontal shift register 122.

Digital data sampled successively by the sampling switches 102-1 to 102-n is supplied to level shifters which function as the level converter. The level shifters 104-1 to 104-n shift the signal level of respective sampling data to a power source voltage (Vd) level of a horizontal driving circuit system based on a level shift pulse given by the horizontal shift register 122. Respective sampling data shifted by level shifts 104-1 to 104-n are held during one horizontal time period by the latches 106-1 to 106-n.

Respective latch data of latches 106-1 to 106-n are converted to analog signals by the DACs 108-1 to 108-n, and supplied to the buffers 110-1 to 110-n. The buffers 110-1 to 110-n drive the data lines 114-1 to 114-n based on analog signals given by the DACs 108-1 to 108-n.

A digital signal having a signal level less than that of a power source voltage (Vdd) of the horizontal driving circuit system is transmitted until one switch is input to the corresponding data line, applied to the corresponding pixel. Before input of the digital signal to the corresponding data line, the level shifter amplifies the digital signal. Thus, the dynamic power consumption depleted during digital signal transmission in data lines is increased. In the apparatus, DACs with lower speed and smaller size are used for reducing pitch and power requirement of each driving circuit, for example, R-DACs or C-DACs.

However, as the increase resolution and gray levels of an LCD, each driving circuit comprises a level shifter and DACs, even analog buffers, increasing space and power requirements.

Thus, conventional technology integrates level shifters and DACs of each data line at the front end of the data driver, reducing the number of level shifters and DACs. However, the performance requirement of DACs is increased to quickly charge data lines with large loads to a desired voltage level. Thus, an analog buffer 20 using high speed operational amplifiers is required (as shown in FIG. 2). However, power consumption is increased as the performance of the analog buffer increases.

U.S. Pat. No. 6,256,024 discloses a conventional DAC circuit to improve resolution of a display. FIG. 3 shows a conventional DAC disclosed in U.S. Pat. No. 6,256,024.

The DAC shown in FIG. 3 is of the two stage type comprising a first DAC stage 21 and a second DAC stage 22. The first DAC stage 21 receives the m most significant bits of a k bit parallel input signal whereas the second stage 22 receives the n least significant bits where m+n=k.

The first DAC stage 21 selects the upper and lower voltage limits VH and VL from the reference voltages in accordance with the m most significant bits and supplies these to the second DAC stage 22, which performs a linear conversion of the n least significant bits in the voltage range between VL and VH. The output of the second DAC stage 22 is supplied to load $C_{LOAD}$ via the optional buffer 25.

Switch 23A is connected between the output of the first DAC stage 21 supplying the lower voltage limit VL and the output of the converter connected to the load $C_{LOAD}$. The switch 23B is connected between the converter output and the output of the second DAC stage 22 or the buffer 25 when present. The switches 23A and 23B are controlled by non-overlapping two phase clock signals $\Phi 1$ and $\Phi 2$. During a first clock period, when the clock signal $\Phi 1$ is active, the switch 23A is closed and the switch 23B is open, thus the voltage level of the load $C_{LOAD}$ is charged to VL. During a second clock period when the clock signal $\Phi 2$ is active, the switch 23A is open and the switch 23B is closed, thus the voltage level of the load $C_{LOAD}$ is charged to the voltage level at the output of the second DAC stage 22.

However, as the voltage level of data lines highly varies, the conventional DAC disclosed in U.S. Pat. No. 6,256,024 can not charge the selected data line to a desired voltage level immediately, deteriorating resolution.

SUMMARY

Methods and devices for digital to analog conversion are provided. An embodiment of a digital to analog converter circuit comprises: a first MSB (most significant bits) digital to analog converter for receiving MSB data of a first digital image signal in a first clock period, and outputting a first voltage range signal indicating a first voltage range according to the MSB data of the first digital image signal; a second MSB digital to analog converter for receiving MSB data of a second digital image signal in a second clock period immediately following the first clock period, and outputting a second voltage range signal indicating a second voltage range according to the MSB data of the second digital image signal; a delay circuit for sampling and holding LSB (last significant bits) data of the first digital image signal in the first clock period, sampling and holding LSB data of the second digital image signal, and outputting the LSB data of the first digital image signal in the second clock period, and outputting the LSB data of the second digital image signal in a third clock period immediately following the second clock period; an LSB digital to analog converter coupled to the delay circuit for receiving the LSB data of the first digital image signal in the second clock period, outputting first image data within the first voltage range according to the LSB data of the first digital image signal, receiving the LSB data of the second digital image signal in the third clock period, and outputting second image data within the second voltage range according to the LSB data of the second digital image signal; a first switch coupled between the first MSB digital to analog converter and the LSB digital to analog converter, turning on in the second clock period for providing the first voltage range signal to the LSB digital to analog converter; and a second switch coupled between the second MSB digital to analog converter and the LSB digital to analog converter, turning on in the third clock period for providing the second voltage range signal to the LSB digital to analog converter.

An embodiment of a liquid crystal display driving circuit comprises: a first MSB (most significant bits) digital to analog converter for receiving MSB data of the first digital image signal in a first clock period, and outputting a first voltage range signal indicating a first voltage range according to the MSB data of the first digital image signal; a second MSB digital to analog converter for receiving MSB data of the second digital image signal in a second clock period immediately following the first clock period, and outputting a second voltage range signal indicating a second voltage range according to the MSB data of the second digital image signal; a delay circuit for sampling and holding LSB data of the first digital image signal in the first clock period, sampling and holding LSB data of the second digital image signal, and outputting the LSB data of the first digital image signal in the second clock period, and outputting the LSB data of the second digital image signal in a third clock period immediately following the second clock period; an LSB digital to analog converter coupled to the delay circuit for receiving the LSB data of the first digital image signal in the second clock period, outputting first image data within the first voltage range according to the LSB data of the first digital image signal, receiving the LSB data of the second digital image signal in the third clock period, and outputting second image data within the second voltage range according to the LSB data of the second digital image signal; a first switch coupled between the first MSB digital to analog converter and the LSB digital to analog converter, turning on in the second clock period for providing the first voltage range signal to the LSB digital to analog converter; and a second switch coupled between the second MSB digital to analog converter and the LSB digital to analog converter, turning on in the third clock period for providing the second voltage range signal to the LSB digital to analog converter.

An embodiment of a method of digital to analog conversion comprises: sampling and holding the LSB data of the first digital image signal, and outputting a first voltage range signal indicating a first voltage range according to the MSB data of the first digital image signal in a first clock period; outputting the LSB data of the first digital image signal, and outputting a second voltage range signal indicating a second voltage range according to the MSB data of the second digital image signal, in a second clock period immediately following the first clock period; and outputting first image data within the first voltage range according to the LSB data of the first digital image signal in the second clock period.

BRIEF DESCRIPTION OF THE DRAWINGS

The invention will become more fully understood from the detailed description, given hereinbelow, and the accompanying drawings. The drawings and description are provided for purposes of illustration only and, thus, are not intended to be limiting of the present invention.

DETAILED DESCRIPTION

First Embodiment

Figure 1:
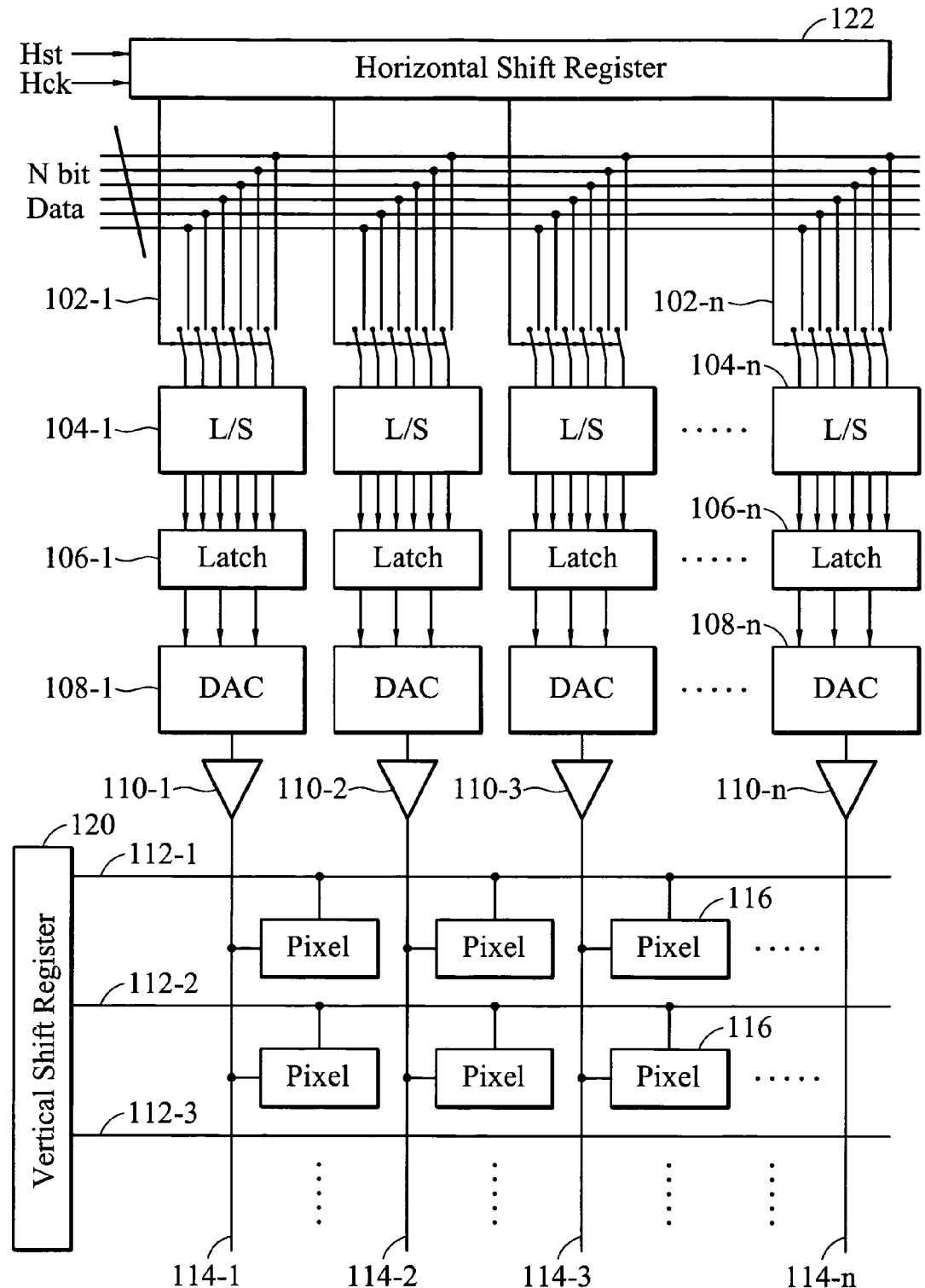
FIG. 1 is a block diagram showing a conventional LTPS TFT-LCD.
Figure 2:
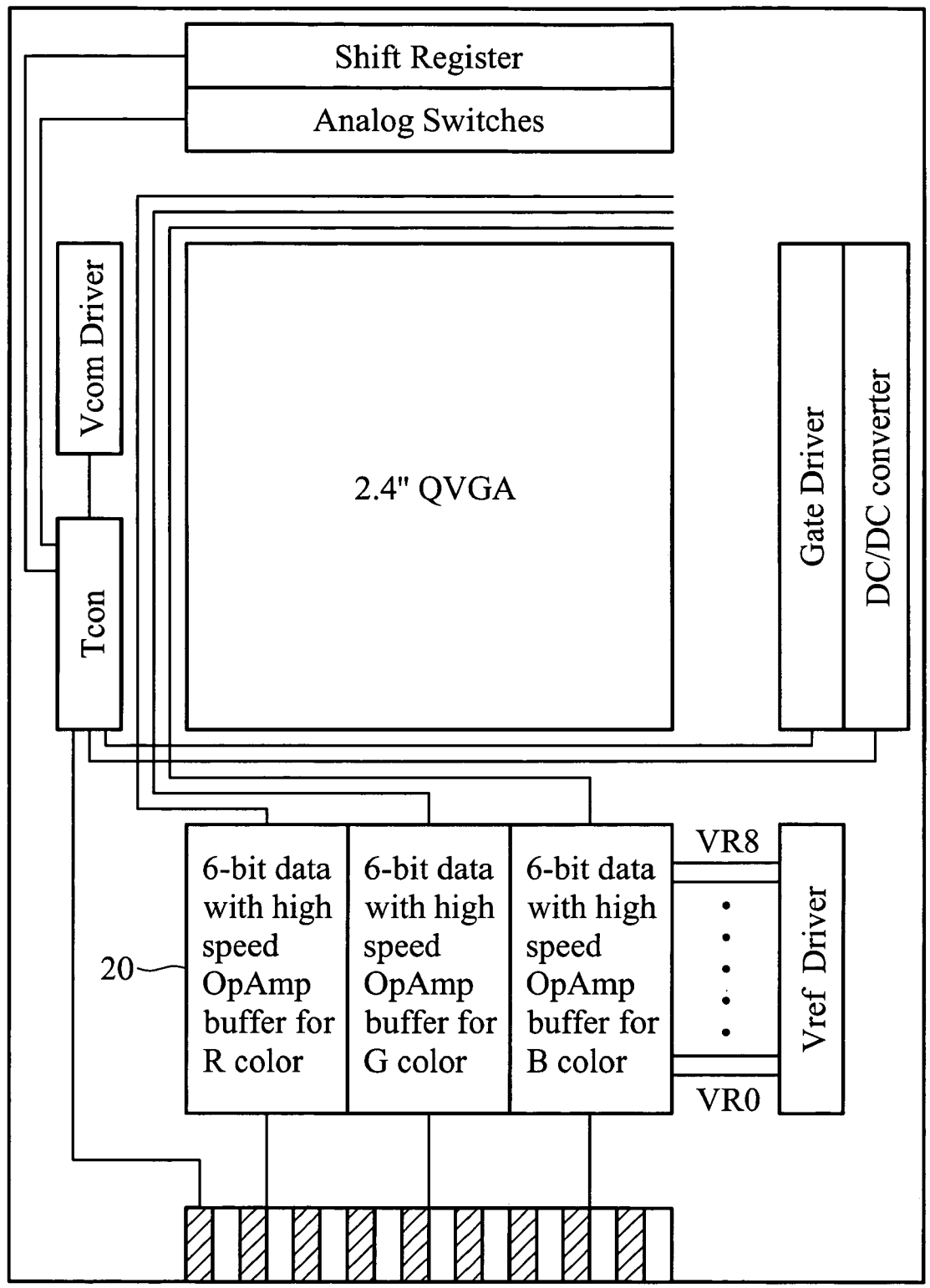
FIG. 2 is a block diagram showing a conventional LCD using a high speed operational amplifier buffer.
Figure 3:
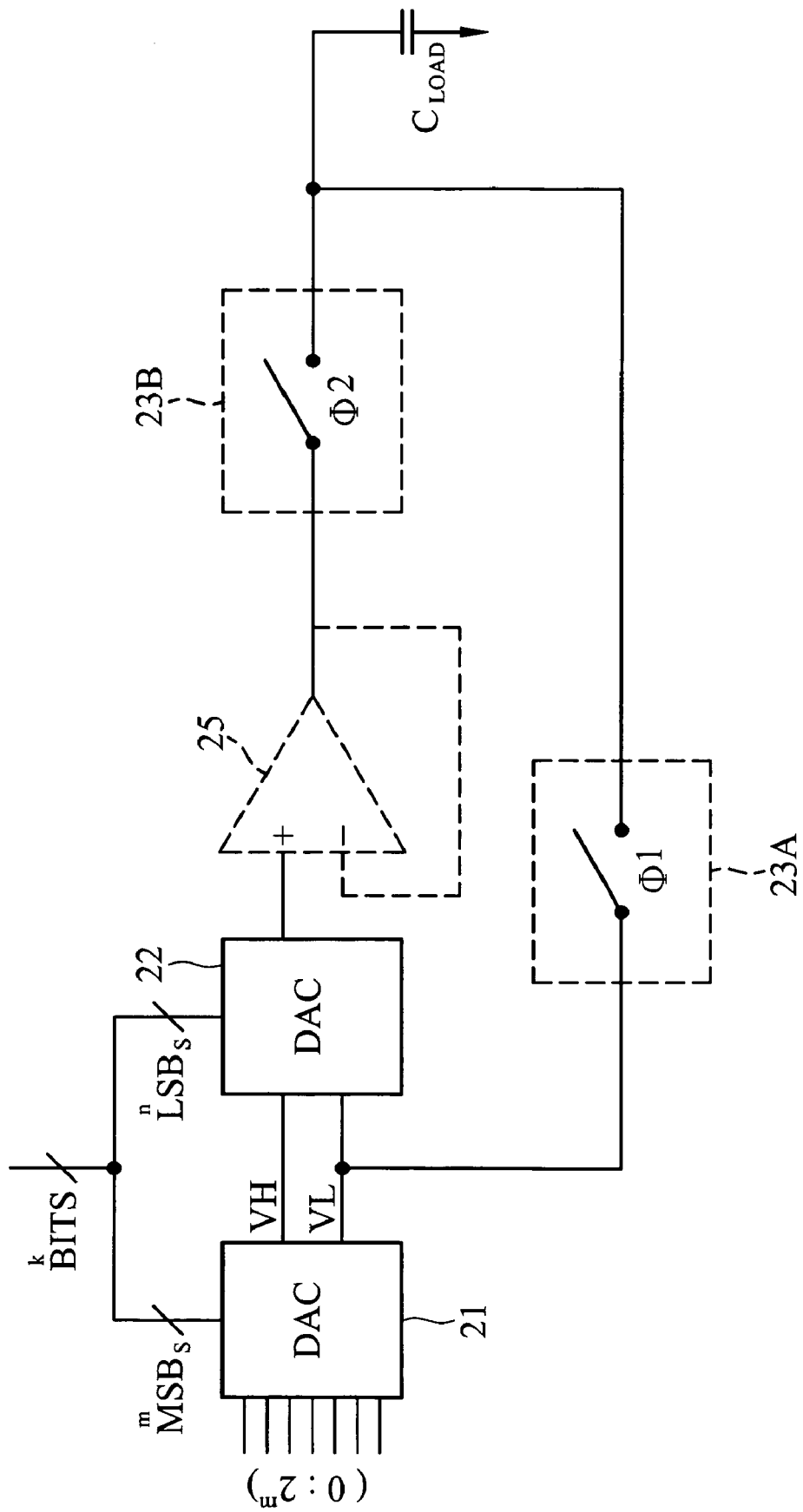
FIG. 3 shows a conventional DAC disclosed in U.S. Pat. No. 6,556,162.
Figure 4:
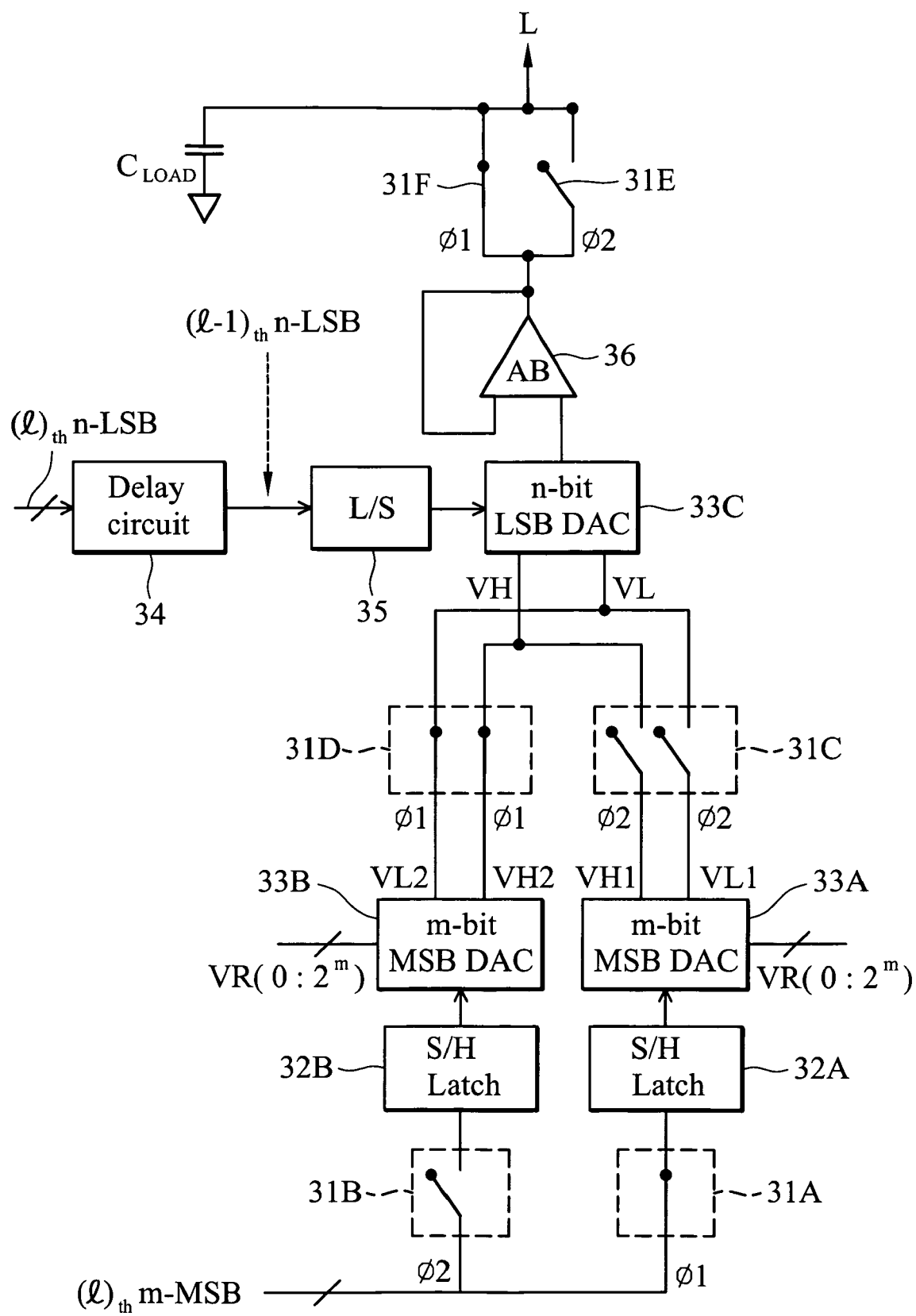
FIG. 4 shows a DAC circuit according to the first embodiment of the invention.

FIG. 4 shows a DAC circuit according to the first embodiment of the invention. The DAC circuit according to the first embodiment of the invention processes digital image signals for display on LCD panel 30. A K bits digital image signal comprises m most significant bits (MSB) and n least significant bits (LSB) where m+n=k. In addition, the (l−1)th digital image signal, the (l)th digital image signal, and the (l+1)th digital image signal are output in sequence.

During a first clock period $\phi 1$, switch 31A is turned on, first S/H latch 32A samples and holds m bits MSB of the (l)th digital image signal $((l)_{th}$ m-MSB), during a second clock period $\phi 2$, switch 31B is turned on, second S/H latch 32B samples and holds m bits MSB of the (l+1)th digital image signal $((l+1)$th m-MSB). Here, first clock period $\phi 1$ and second clock period $\phi 2$ are respectively a complete selection period of a data line, and second clock period $\phi 2$ immediately follows first clock period $\phi 1$. In addition, first S/H latch 32A and second S/H latch 32B may further include level shifters to adjust the voltage level of the received digital image signals, for example, adjusting the level of the high voltage level signal within a high level margin.

MSB DAC 33A selects the voltage range between upper and lower voltage limits VH1 and VL1 from the reference voltages VR(0:2$^m$) in accordance with received digital image signal $((l)_{th}$ m-MSB) in first clock period $\phi 1$, MSB DAC 33B selects the voltage range between upper and lower voltage limits VH2 and VL2 from the reference voltages VR (0:2$^m$) in accordance with received digital image signal $((l+1)_{th}$ m-MSB) in second clock period $\phi 2$. According to this embodiment, the upper voltage limits VH1/VH2 and lower voltage limits VL1/VL2 respectively generated by MSB DACs 33A and 33B are input to LSB DAC 33C because the switches 31C and 31D are turned on. Switch 31C is turned on in second clock period $\phi 2$, and is turned off in first clock period $\phi 1$. Switch 31D is turned on in first clock period $\phi 1$, is turned off in second clock period $\phi 2$, and can be turned on in third clock period $\phi 3$, which immediately follows second clock period $\phi 2$.

In first clock period $\phi 1$, n bits LSB of the (l)th digital image signal $((l)_{th}$ n-LSB) is input to delay circuit 34, and a previous (l−1)th digital image signal $((l−1)_{th}$ n-LSB) is input to LSB DAC 33C. In second clock period $\phi 2$, n bits LSB of the (l)th digital image signal $((l)_{th}$ n-LSB) are input to LSB DAC 33C, and a next (l+1)th digital image signal (((l+1)$_{th}$ n-LSB) is input to delay circuit 34, which is output in third clock period φ3. Level shifter (L/S) 35 adjusts the voltage level at the output of delay circuit 34, for example, adjusting the level of the high voltage level signal to be within the high level margin.

In second clock period φ2, LSB DAC 33C outputs a voltage level to the load C$_{LOAD}$ via buffer 36 according to signal ((l)$_{th}$ n-LSB) output from delay circuit 34 and a voltage range between VL1 and VH1 corresponding to the output of MSB DACs 33A. Switch 31E is turned off in first clock period φ1, and is turned on in second clock period φ2. Switch 31F is turned on in first clock period φ1, and turned off in second clock period φ2. As switches 31E or 31F is turned on, the load C$_{LOAD}$ and data line L are charged to the voltage level output from LSB DAC 33C via buffer 36.

In third clock period φ3, LSB DAC 33C outputs a voltage level to the load C$_{LOAD}$, via buffer 36 according to signal ((l+1)$_{th}$ n-LSB) output from delay circuit 34 and a voltage range between VL2 and VH2 corresponding to the output of MSB DACs 33B. As one of the switches 31E and 31F is turned on, the load C$_{LOAD}$ and data line L are charged to the voltage level output from LSB DAC 33C via buffer 36.

Second Embodiment

Figure 5:
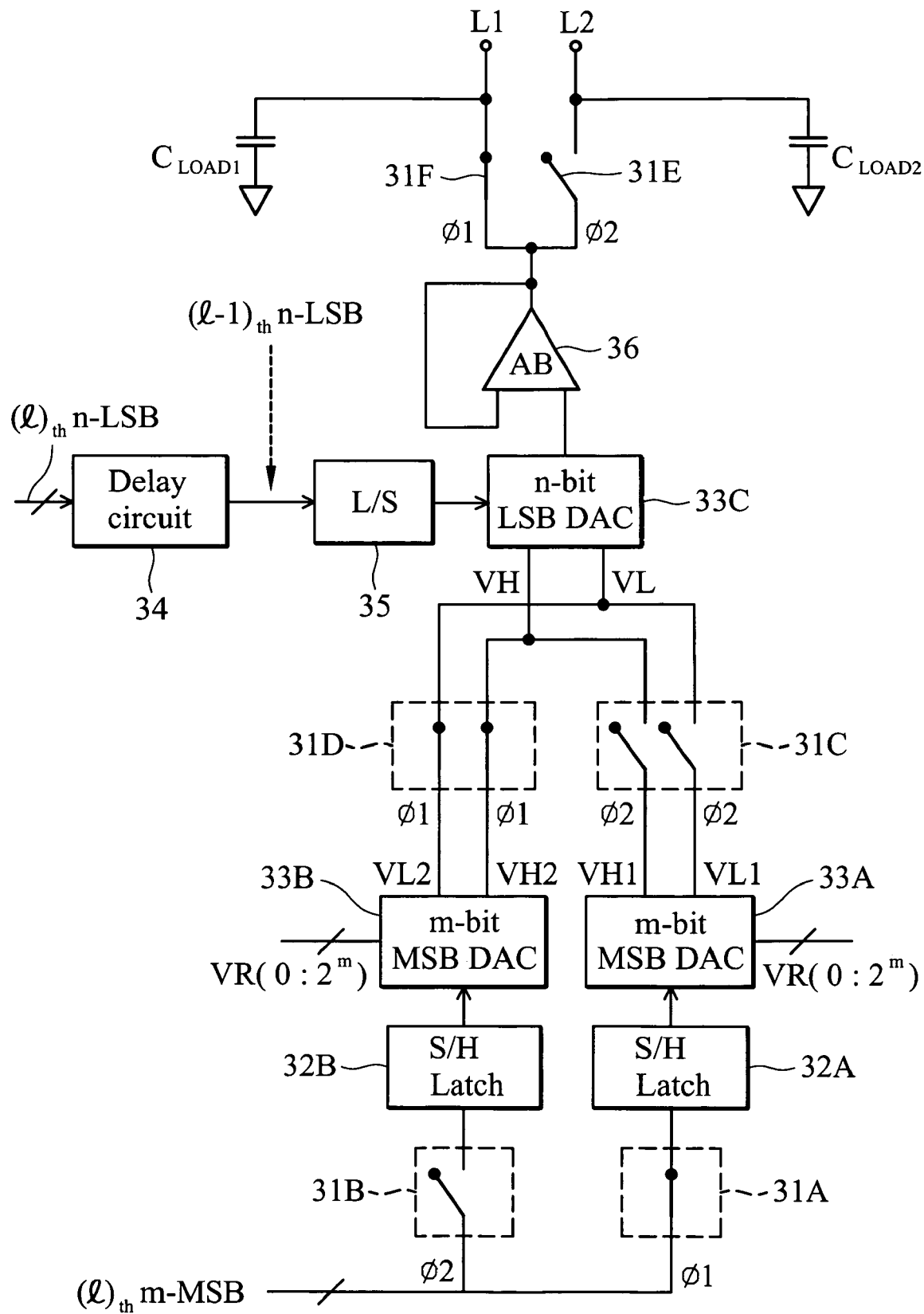
FIG. 5 shows a DAC circuit according to the second embodiment of the invention.

FIG. 5 shows a DAC circuit according to the second embodiment of the invention. The difference between the second embodiment and the first embodiment is that switch 31F is connected to data line L1, and switch 31E is connected to data line L2. According to the second embodiment, the operating frequency of shift register is decreased to achieve higher resolution.

According to the invention, two digital image signal corresponding to different data lines are respectively input to two corresponding MSB DACs in different sequence clock period. The MSB DAC obtains a corresponding voltage range according to digital image signal ((l)$_{th}$ m-MSB) in a present clock period (first clock period φ1), and outputs the voltage range to LSB DAC in the next clock period (second clock period φ2). The LSB DAC then outputs an analog signal to the data line accordingly. In addition, the next digital image signal is input to another MSB DAC for determining a voltage range according to the received digital image signal in the clock period (second clock period φ2). The LSB DAC then outputs another analog signal to the another data line accordingly. In the invention, the information is generated by MSB DAC in a current clock period, and is output to the LSB DAC with its delayed LSB data in the next clock period. Thus, MSB DAC has sufficient process time for generating the voltage range. Thus, the resolution of LCD is not deteriorated by MSB DACs.

Figure 6:
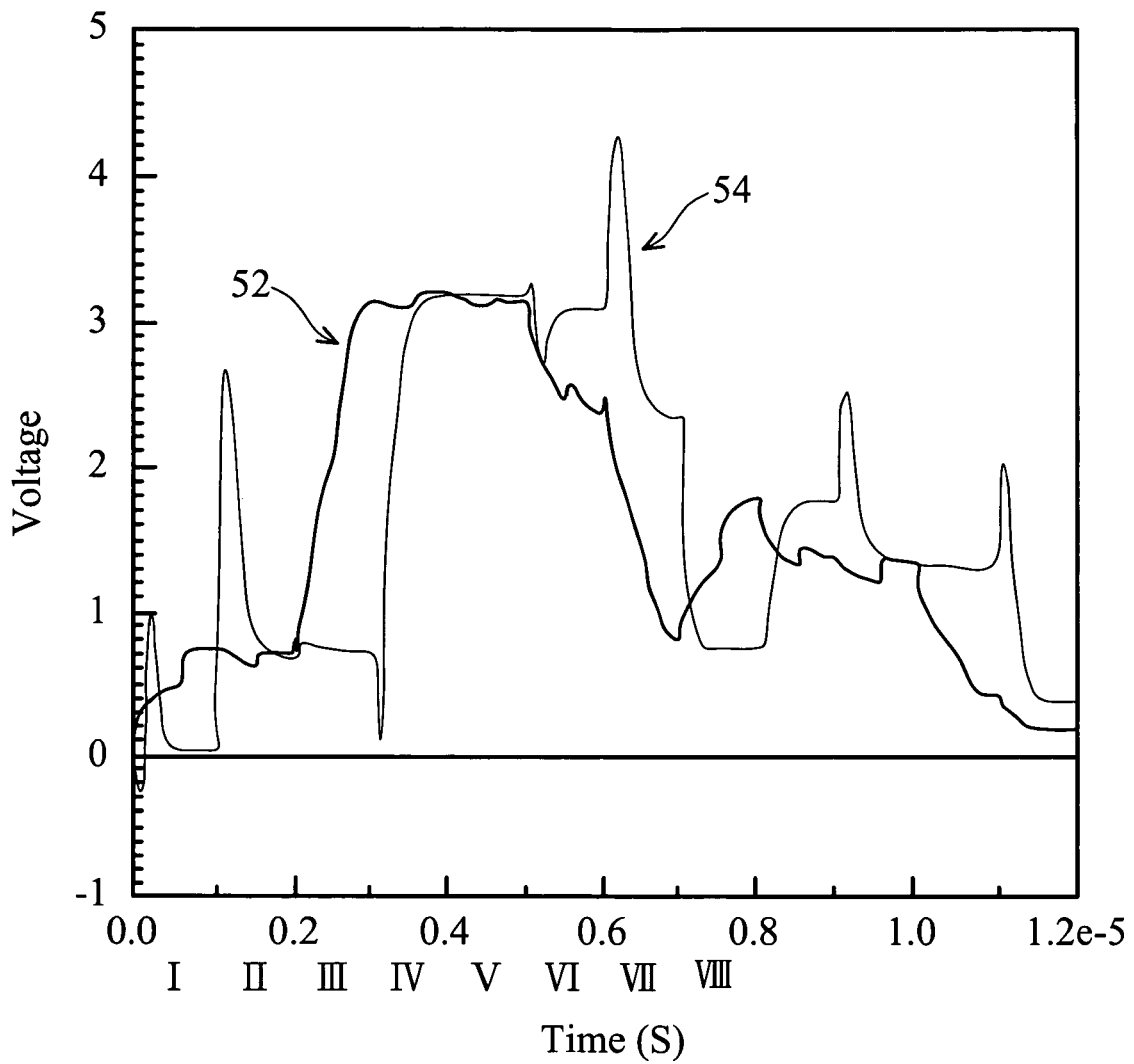
FIG. 6 shows the simulation result of the output signal by the circuit according to the embodiments of the invention.

FIG. 6 shows the simulation result of the output signal of the circuit according to the embodiments of the invention. Label 52 denotes the waveform output by the DAC disclosed in U.S. Pat. No. 6,556,162, and label 54 denotes the waveform output by the DAC according to the embodiments of the invention. The waveform 54 output by the DAC according to embodiments of the invention is shifted by one clock period compared with the waveform 52 output by that disclosed in U.S. Pat. No. 6,556,162, because the LSB data input to the LSB DAC is delayed by one clock period. As shown in FIG. 6, the voltage level of the third data of waveform 52 is lower than that of the fourth data of waveform 54, and the voltage level of the seventh data of waveform 52 is higher than that of the eighth data of waveform 54. As the voltage difference between sequential data exceeds a predetermined range, the conventional technology disclosed in U.S. Pat. No. 6,556,162 cannot update data immediately in a clock period. Thus, the invention solves the problems of the conventional technology. The LCD using the DACs according to the embodiments of the invention achieve higher operating frequency without influencing resolution.

The foregoing description of several embodiments have been presented for the purpose of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A digital to analog converter circuit, comprising:
a first MSB (most significant bits) digital to analog converter for receiving MSB data of a first digital image signal in a first clock period, and outputting a first voltage range signal according to the MSB data of the first digital image signal;
a second MSB digital to analog converter for receiving MSB data of a second digital image signal in a second clock period immediately following the first clock period, and outputting a second voltage range signal according to the MSB data of the second digital image signal;
a delay circuit for sampling and holding LSB (last significant bits) data of the first digital image signal in the first clock period, sampling and holding LSB data of the second digital image signal, outputting the LSB data of the first digital image signal in the second clock period, and outputting the LSB data of the second digital image signal in a third clock period immediately following the second clock period;
an LSB digital to analog converter, coupled to the delay circuit, for receiving the LSB data of the first digital image signal in the second clock period, outputting first image data within the first voltage range according to the LSB data of the first digital image signal, receiving the LSB data of the second digital image signal in the third clock period, and outputting second image data within the second voltage range according to the LSB data of the second digital image signal;
a first switch, coupled to the first MSB digital to analog converter and the LSB digital to analog converter and turned on in the second clock period, for providing the first voltage range signal to the LSB digital to analog converter; and
a second switch, coupled to the second MSB digital to analog converter and the LSB digital to analog converter and turned on in the third clock period, for providing the second voltage range signal to the LSB digital to analog converter.

2. The digital to analog converter circuit of claim 1, further comprising a first latch coupled to the first MSB digital to analog converter for sampling and holding the MSB data of the first digital image signal.

3. The digital to analog converter circuit of claim 2, further comprising a first level shifter for adjusting a voltage level of the MSB data of the first digital image signal.

4. The digital to analog converter circuit of claim 1, further comprising a second latch coupled to the second MSB digital to analog converter for sampling and holding the MSB data of the second digital image signal.

5. The digital to analog converter circuit of claim 4, further comprising a second level shifter for adjusting a voltage level of the MSB data of the second digital image signal.

6. The digital to analog converter circuit of claim 1, further comprising a third level shifter for adjusting voltage levels of the LSB data of the first digital image signal and the LSB data of the second digital image signal.

7. The digital to analog converter circuit of claim 1, further comprising:
   a third switch, coupled to the first MSB digital to analog converter and turned on in the first clock period, for providing the MSB data of the first digital image signal to the first MSB digital to analog converter; and
   a fourth switch, coupled to the second MSB digital to analog converter and turned on in the second clock period, for providing the MSB data of the second digital image signal to the second MSB digital to analog converter.

8. The digital to analog converter circuit of claim 1, further comprising a buffer coupled between the LSB digital to analog converter and data lines of a liquid crystal display panel.

9. The digital to analog converter circuit of claim 1, further comprising:
   a first data line;
   a second data line;
   a third switch, coupled to the LSB digital to analog converter and the first data line and turned on in the second clock period, for providing the first image data to the first data line; and
   a fourth switch, coupled between the LSB digital to analog converter and the second data line and turned on in the third clock period, for providing the second image data to the second data line.

10. A liquid crystal display driving circuit for outputting a first digital image signal and a second digital image signal in sequence, the first digital image signal and the second digital image signal, respectively, comprising MSB (most significant bits) data and LSB (last significant bits) data, the liquid crystal display driving comprising:
   a first MSB (most significant bits) digital to analog converter for receiving MSB data of the first digital image signal in a first clock period, and outputting a first voltage range signal indicating a first voltage range according to the MSB data of the first digital image signal;
   a second MSB digital to analog converter for receiving MSB data of the second digital image signal in a second clock period immediately following the first clock period, and outputting a second voltage range signal indicating a second voltage range according to the MSB data of the second digital image signal;
   a delay circuit for sampling and holding LSB data of the first digital image signal in the first clock period, sampling and holding LSB data of the second digital image signal, and outputting the LSB data of the first digital image signal in the second clock period, and outputting the LSB data of the second digital image signal in a third clock period immediately following the second clock period;
   an LSB digital to analog converter, coupled to the delay circuit, for receiving the LSB data of the first digital image signal in the second clock period, outputting first image data within the first voltage range according to the LSB data of the first digital image signal, receiving the LSB data of the second digital image signal in the third clock period, and outputting second image data within the second voltage range according to the LSB data of the second digital image signal;
   a first switch coupled between the first MSB digital to analog converter and the LSB digital to analog converter, turning on in the second clock period for providing the first voltage range signal to the LSB digital to analog converter; and
   a second switch coupled between the second MSB digital to analog converter and the LSB digital to analog converter, turning on in the third clock period for providing the second voltage range signal to the LSB digital to analog converter.

11. The liquid crystal display driving circuit of claim 10, wherein the first image data and the second image data are provided to data lines.

12. The liquid crystal display driving circuit of claim 10, further comprising a first latch coupled to the first MSB digital to analog converter for sampling and holding the MSB data of the first digital image signal.

13. The liquid crystal display driving circuit of claim 12, further comprising a first level shifter for adjusting a voltage level of the MSB data of the first digital image signal.

14. The liquid crystal display driving circuit of claim 10, further comprising a second latch coupled to the second MSB digital to analog converter for sampling and holding the MSB data of the second digital image signal.

15. The liquid crystal display driving circuit of claim 14, further comprising a second level shifter for adjusting a voltage level of the MSB data of the second digital image signal.

16. The liquid crystal display driving circuit of claim 10, further comprising a third level shifter for adjusting voltage levels of the LSB data of the first digital image signal and the LSB data of the second digital image signal.

17. The liquid crystal display driving circuit of claim 11, further comprising a buffer coupled between the LSB digital to analog converter and the data line.

18. The liquid crystal display driving circuit of claim 10, further comprising:
   a third switch coupled to the first MSB digital to analog converter, turning on in the first clock period for providing the MSB data of the first digital image signal to the first MSB digital to analog converter; and
   a fourth switch coupled to the second MSB digital to analog converter, turning on in the second clock period for providing the MSB data of the second digital image signal to the second MSB digital to analog converter.

19. A method of digital to analog conversion for outputting a first digital image signal and a second digital image signal in sequence, the first digital image signal and the second digital image signal, respectively, comprising MSB (most significant bits) data and LSB (last significant bits) data, the method comprising:
   sampling the LSB data of the first digital image signal;
   providing a first voltage range signal indicative of a first voltage range in accordance with the MSB data of the first digital image signal in a first clock period;
   providing the LSB data of the first digital image signal;
   providing a second voltage range signal indicative of a second voltage range in accordance with the MSB data of the second digital image signal, in a second clock period immediately following the first clock period; and providing first image data within the first voltage range in accordance with the LSB data of the first digital image signal in the second clock period.

20. The method of claim 19, further comprising:

sampling the LSB data of the second digital image signal in the second clock period; and providing second image data within the second voltage range in accordance with the LSB data of the second digital image signal in a third clock period immediately following the second clock period.

21. A liquid crystal display incorporating the digital to analog converter circuit of claim 1.

* * * * *